(12) United States Patent
Xie et al.

(10) Patent No.: US 9,722,024 B1
(45) Date of Patent: Aug. 1, 2017

(54) FORMATION OF SEMICONDUCTOR STRUCTURES EMPLOYING SELECTIVE REMOVAL OF FINS

(71) Applicant: GLOBALFOUNDRIES Inc., Grand Cayman (KY)

(72) Inventors: Ruilong Xie, Schenectady, NY (US); Catherine B. Labelle, Schenectady, NY (US); Min Gyu Sung, Latham, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/178,134

(22) Filed: Jun. 9, 2016

(51) Int. Cl.
| | |
|---|---|
| H01L 29/10 | (2006.01) |
| H01L 29/66 | (2006.01) |
| H01L 21/3065 | (2006.01) |
| H01L 21/308 | (2006.01) |
| H01L 29/78 | (2006.01) |
| H01L 29/16 | (2006.01) |

(52) U.S. Cl.
CPC ...... *H01L 29/1037* (2013.01); *H01L 21/3065* (2013.01); *H01L 21/3081* (2013.01); *H01L 21/3085* (2013.01); *H01L 21/3086* (2013.01); *H01L 29/16* (2013.01); *H01L 29/66795* (2013.01); *H01L 29/7851* (2013.01)

(58) Field of Classification Search
CPC .......... H01L 29/1037; H01L 29/66795; H01L 29/7851; H01L 21/3065; H01L 21/3081; H01L 21/3085; H01L 21/3086
See application file for complete search history.

(56) References Cited

U.S. PATENT DOCUMENTS

| | | | | |
|---|---|---|---|---|
| 8,569,152 B1 * | 10/2013 | Basker | ............. | H01L 29/66795 257/328 |
| 9,318,342 B2 | 4/2016 | Xie et al. | | |
| 2014/0227857 A1 * | 8/2014 | Youn | ................ | H01L 21/76229 438/427 |
| 2014/0367795 A1 * | 12/2014 | Cai | ..................... | H01L 27/0886 257/392 |
| 2015/0060959 A1 * | 3/2015 | Lin | ....................... | H01L 29/785 257/288 |
| 2015/0162339 A1 * | 6/2015 | Divakaruni | ....... | H01L 27/11521 257/321 |

(Continued)

*Primary Examiner* — Nathan W Ha
(74) *Attorney, Agent, or Firm* — Heslin Rothenberg Farley and Mesiti PC

(57) ABSTRACT

Formation of semiconductor structures employing selective removal of fins includes, for example, providing a substrate having a first plurality of fins having first hard masks thereon, a second plurality of fins having second hard masks thereon, the first hard mask being different from the second hard mask, depositing a first fill material between lower portions of the first and second fins, depositing a third hard mask layer on the first fill material between the first and second fins, depositing a second fill material on the third hard mask extending between upper portions of the first and second fins, selectively removing the second hard masks and the second fins to form open cavities in the first and second fill material, depositing a third fill material in the opened cavities, and removing the second fill material and the third fill material above the third hard mask to form a fin-cut region.

16 Claims, 7 Drawing Sheets

(56) References Cited

U.S. PATENT DOCUMENTS

| | | | |
|---|---|---|---|
| 2015/0249153 A1* | 9/2015 | Morin | H01L 29/785 257/192 |
| 2015/0279971 A1* | 10/2015 | Xie | H01L 29/66818 257/401 |
| 2015/0287809 A1* | 10/2015 | Kerber | H01L 21/845 438/479 |
| 2015/0380438 A1* | 12/2015 | Chudzik | H01L 27/1207 257/350 |
| 2016/0071932 A1* | 3/2016 | Sung | H01L 29/1033 257/369 |
| 2016/0204193 A1* | 7/2016 | Hattendorf | H01L 29/66795 257/393 |

\* cited by examiner

US 9,722,024 B1

FORMATION OF SEMICONDUCTOR STRUCTURES EMPLOYING SELECTIVE REMOVAL OF FINS

TECHNICAL FIELD

The present disclosure relates generally to methods for fabricating semiconductor devices, and more particularly, to formation of semiconductor structures employing selective removal of fins.

BACKGROUND OF THE DISCLOSURE

Fin field-effect transistor (FinFET) devices are currently being developed to replace conventional planar metal oxide semiconductor field-effect transistors (MOSFETs) in advanced complementary metal oxide semiconductor (CMOS) technology due to their improved short-channel effect immunity and higher on-current to off-current ratio ($I_{on}/I_{off}$). As is known, the term "fin" refers to a vertical structure within or upon which are formed, for instance, one or more FinFETs or other fin devices, such as passive devices, including capacitors, diodes, etc.

SUMMARY OF THE DISCLOSURE

The shortcomings of the prior art are overcome and additional advantages are provided through the provision, in one aspect, of a method which includes, for instance, providing a substrate having a first plurality of fins having first hard masks thereon, a second plurality of fins having second hard masks thereon, the first hard mask being different from the second hard mask, depositing a first fill material between lower portions of the first and second plurality of fins, depositing a third hard mask layer on the first fill material between the first and the second plurality of fins, depositing a second fill material on the third hard mask extending between upper portions of the first and second plurality of fins, selectively removing the second hard masks and the second plurality of fins to form open cavities in the first and second fill material, depositing a third fill material in the opened cavities, and removing the second fill material and the third fill material above the third hard mask to form a fin-cut region.

In another aspect, a semiconductor structure includes, for example, a intermediate semiconductor substrate including, for example, a substrate, a plurality of fins spaced at a distance D1, a fill material disposed along lower portions of the plurality of fins, a fin-cut regions having a distance D2 disposed between the plurality of fins, and wherein the fin-cut region include trenches in the fill material spaced at a distance D1.

Additional features and advantages are realized through the techniques of the present disclosure. Other embodiments and aspects of the present disclosure are described in detail herein and are considered a part of the claims.

BRIEF DESCRIPTION OF THE DRAWINGS

The subject matter of the present disclosure is particularly pointed out and distinctly claimed in the concluding portion of the specification. The disclosure, however, may best be understood by reference to the following detailed description of various embodiments and the accompanying drawings in which:

DETAILED DESCRIPTION OF THE DISCLOSURE

The present disclosure and certain features, advantages, and details thereof, are explained more fully below with reference to the non-limiting embodiments illustrated in the accompanying drawings. Descriptions of well-known materials, fabrication tools, processing techniques, etc., are omitted so as to not unnecessarily obscure the disclosure in detail. It should be understood, however, that the detailed description and the specific examples, while indicating embodiments of the present disclosure, are given by way of illustration only, and are not by way of limitation. Various substitutions, modifications, additions and/or arrangements within the spirit and/or scope of the underlying concepts will be apparent to those skilled in the art from this disclosure. Reference is made below to the drawings, which are not drawn to scale for ease of understanding, wherein the same reference numbers used throughout different figures designate the same or similar components.

The present disclosure is directed to formation of semiconductor devices such as FinFET devices, which employs selective removal of some of the fins such as for forming trenches between the remaining fins. As described in greater detail below, for example, formation of semiconductor devices using hard masks having different properties allows initially forming a plurality of fins, and then exploiting the differences in the hard masks to selectively remove some of the fins. In addition, a third hard mask may be employed to anchor the fin reveal position. As will be appreciated, the present disclosure may provide benefits and advantages over conventional selective removal of fins such as a "fin cut first" process or a "fin cut last" process.

FIGS. 1-17 diagrammatically illustrate a method according to an embodiment of the present disclosure for forming an intermediate semiconductor device having a plurality of fins and employing selective removal of some of the fins.

Figure 1:
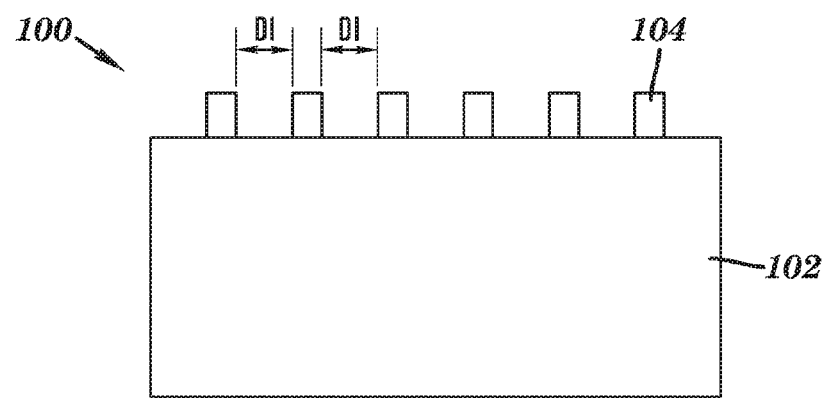
FIGS. 1-17 cross-sectional views diagrammatically illustrating a method for forming semiconductor structures employing selective removal of fins according to an embodiment of the present disclosure.

FIG. 1 illustrates a cross-sectional view of a starting intermediate semiconductor structure 100 having a bulk semiconductor substrate 102 and a patterned hard masks 104 disposed on semiconductor substrate 102. The patterned hard mask may have an equal spacing D1 therebetween. Substrate 102 may be formed from silicon or any semiconductor material including, but not limited to, silicon (Si), germanium (Ge), a compound semiconductor material, a layered semiconductor material, a silicon-on-insulator (SOI) material, a SiGe-on-insulator (SGOI) material, and/or a germanium-on-insulator (GOI) material, or other suitable semiconductor material or materials. Patterned hard masks 104 may be a SiBCN, or SiCO, or SiN. Patterned hard masks 104 may be formed from a first hard mask layer using conventional lithography and etching techniques. As one skilled in the art will understand, where, as in the present example, a semiconductor material is used, many fins may be formed, is repeated a large number of times across the substrate such as a wafer.

Figure 2:
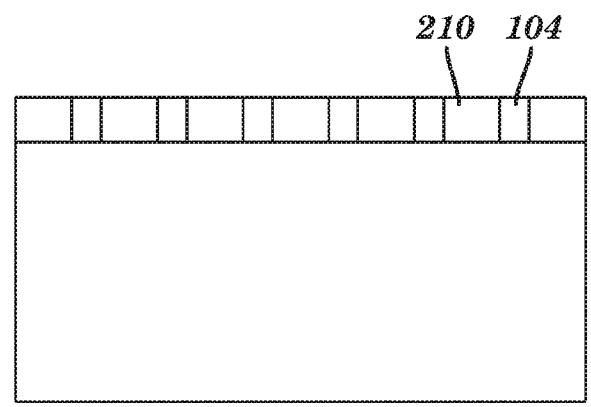

As shown in FIG. 2, a fill material such as an oxide layer may be deposited on patterned hard masks 104 and portions of the fill material removed, for example, by a chemical-mechanical process (CMP) resulting in fill material 210 disposed between patterned hard masks 104.

Figure 3:
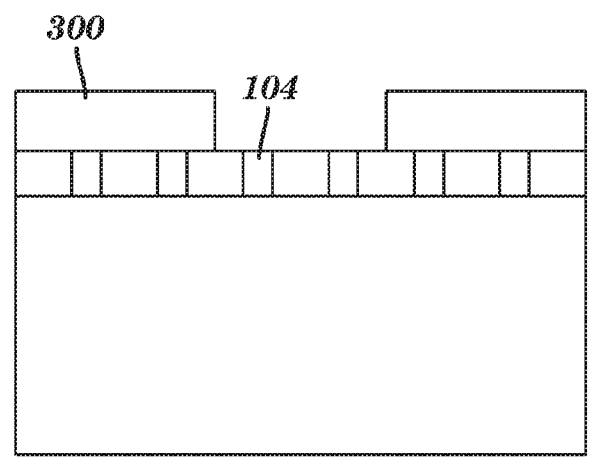
Figure 4:
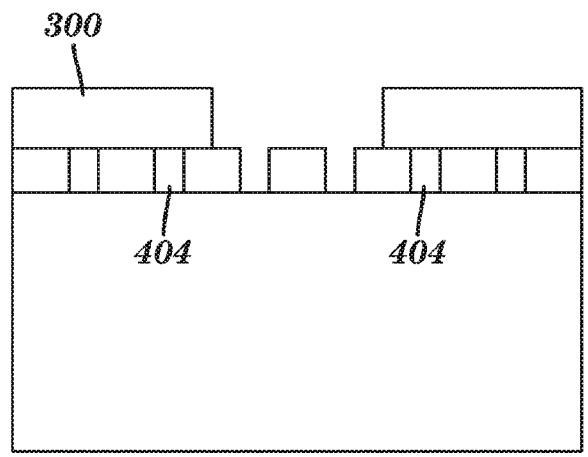

Thereafter, a blocking material layer such as an organic planarization layer (OPL) is deposited over the structure of FIG. 2 and patterned resulting in a patterned blocking layer 300 to expose some of the patterned hard masks 104 as shown in FIG. 3. A etch process is performed on the structure of FIG. 3 which selectively removes some of the exposed hard masks 104 resulting in remaining first hard masks 404 as shown in FIG. 4.

Figure 5:
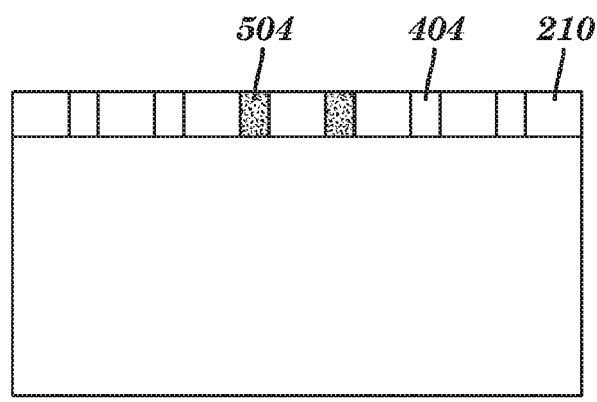

With reference to FIG. 5, patterned blocking layer 300 (FIG. 4) is removed or stripped, a second hard mask layer having a material different from the material of the hard masks 404 is deposited, and portions of the second hard mask layer is removed, for example, by a chemical-mechanical process (CMP) resulting in second hard masks 504. For example, second hard masks 504 may be formed from silicon nitride (SiN), SiBCN, or SiCO. The oxide fill material 210 is removed such as by a buffered HF or a diluted HF wets process resulting in the structure of FIG. 6. In other embodiments, the first hard mask material may SiN and the second hard mask material may be SiCO. In still other embodiments, the first hard mask material may SiCO and the second hard mask material may be SiN. In further embodiments, the first hard mask and the second hard mask may be SiBCN/SiN; SiN/SiBCN; SiN/SiCO; SiCO/SiN). It will be appreciated that other suitable combinations of materials may be employed for the first hard mask and the second hard mask.

Figure 6:
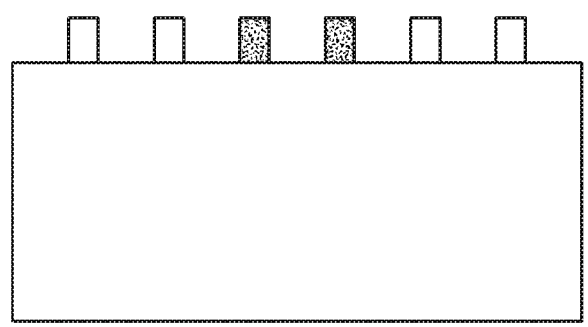
Figure 7:
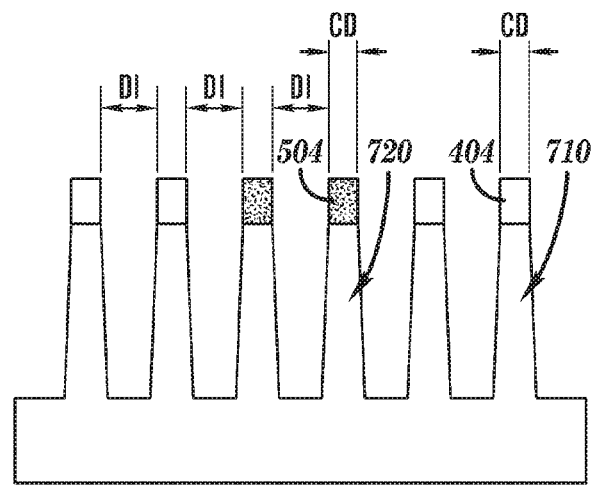
Figure 8:
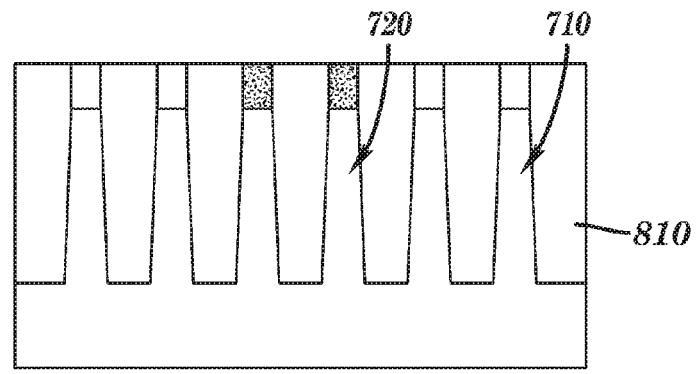

A removal or etching process is employed on the structure of FIG. 6 such as a reactive ion etch or dry etch process on the structure of FIG. 6 resulting in the formation of first fins 710 disposed below first masks 404 and second fins 720 disposed below second masks 504 as shown in FIG. 7. The first fins and the second fins may have a corresponding same critical dimension CD or width, and the first and the second fins may have the same pitch D1 therebetween. Maintaining second hard masks 504 for unwanted fins rather than removing it completely helps to form a sea-of-fins, e.g., with no fin etch loading effects and maintain the fins having a uniform critical dimension. It will be appreciated that if second hard masks 504 are removed before fin etch, then after fin etch, the fin profile/critical dimension inside the dense fin array and fin profile/critical dimension at edge of the array could be different.

A fill material such as an oxide layer may be deposited on the structure of FIG. 7 such as a local STI fill and chemical-mechanical process (CMP) resulting in fill material 810 disposed between fins 710 and 720. In other embodiments, a fin liner such as an Ox/SiN liner may be disposed prior to depositing the fill material.

Figure 9:
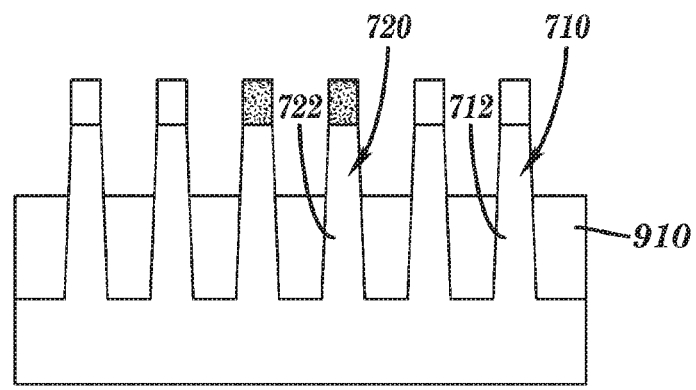

FIG. 9 illustrates a fin reveal, e.g., a wafer with a sea-of-fins. For example, a partial fill material removal process such as an etching is employed resulting in a first fill material 910 disposed along lower portions 712 of first fins 710 and lower portions 722 of second fins 720. For example, the top portion of fill material 810 (FIG. 8) is etched back around fins 710 and 720 to reveal top portions of fins 710 and 720, e.g., with no fin reveal loading effects and maintain the fins having a uniform critical dimension.

Figure 10:
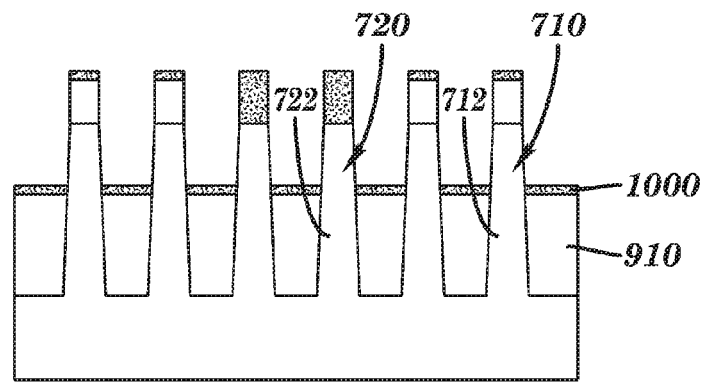

As shown in FIG. 10, a third hard mask layer 1000 is deposited on a top surface of first fill material 910 between first and second fins 710 and 720. For example, a Gas Cluster Ion Beams (GCIB) directional SiN deposition may be employed. In other embodiments, instead of a third hard mask layer, a liner such as a SiN liner, an HfO2 liner, etc. may be employed that extends over the first fill material and the sidewalls of the upper portions of the first and second fins.

Figure 11:
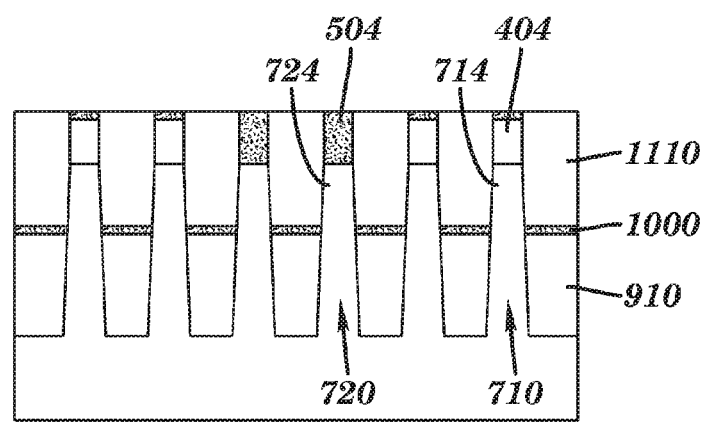

As shown in FIG. 11, a fill material such as an oxide layer may be deposited on the structure of FIG. 10, and portions of the fill material removed, for example, by a chemical-mechanical process (CMP) resulting in a fill material 1110 disposed on third hard mask layer 1000 and extending between upper portions 714 of first fins 710 and upper portions 724 of second fins 720, and between hard mask 404 and 504. Fill material 1110 may be the same as fill material 910.

Figure 12:
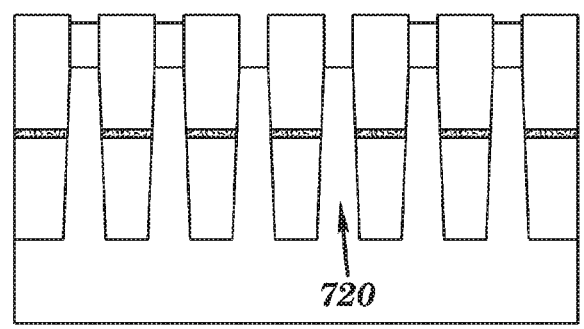

Second hard masks 504 may be removed such as by etching to expose the upper surface of fins 720 as shown in FIG. 12. For example, using an HFEG solution may selectively remove the SiN first hard masks while retaining the SiBCN first hard masks. In other embodiments, the first hard mask may be removed while retaining the second hard masks. For example, SiN hard masks may be selectively removed by dry etch to SiCO.

Figure 13:
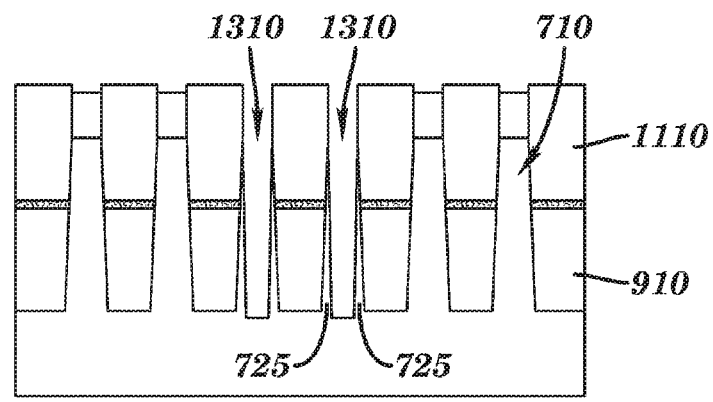

A first fin removal process or etch such as an anisotropic Si etch may be employed on the structure of FIG. 12 to remove a portion of fins 720 resulting in the structure of FIG. 13 having open cavities 1310 between first fill material 910, second fill material 1110, and remaining portions 725 of fins 720 (FIG. 12).

Figure 14:
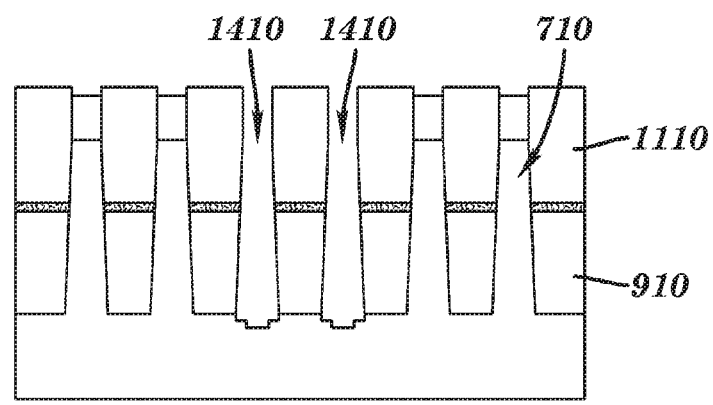

A following or second removal process or etch such as an isotropic Si etch may be performed to enlarge open cavities 1310, e.g., remove remaining portions 725 of fins 720 (FIG. 12) to form enlarged open cavities 1410 between first fill material 910 and second fill material 1110 as shown in FIG. 14. For example, this removal process may be relatively small, e.g., about 6 nanometers, resulting in a small and predictable taper.

With reference again to FIGS. 13 and 14, the selective fin removal or etch processes result in cavities 1310 and 1410 being over etched, e.g., the lower portions of the cavities being disposed below the bottom of remaining fins 710. In other embodiments, removal or etch processes may result in the cavities not being over etched, e.g., the lower portions of the cavities being disposed even with the bottom of remaining fins.

Figure 15:
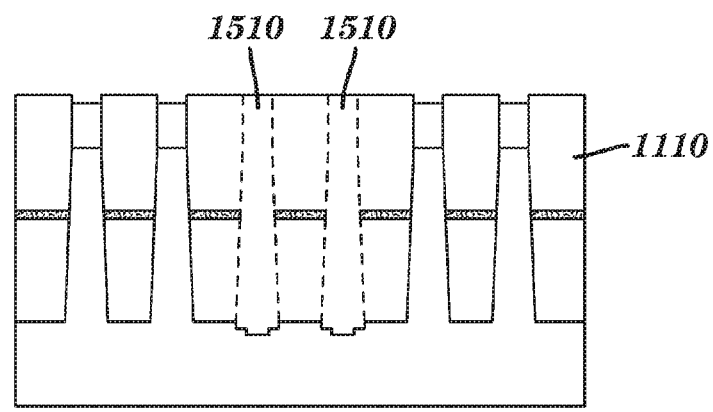

A third fill material is deposit on the structure of FIG. 14 such as an oxide layer, and portions of the third fill material removed, for example, by a chemical-mechanical process (CMP) resulting in a fill material 1510 disposed in cavities 1410 (FIG. 14) as shown in FIG. 15.

Figure 16:
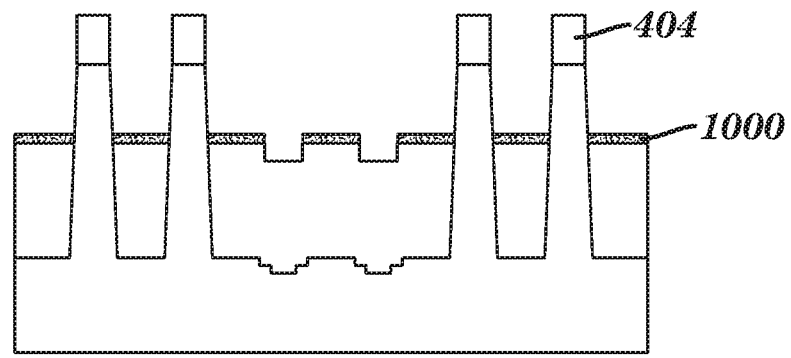

As shown in FIG. 16, a fin reveal or fill material removal is performed on the structure of FIG. 15 to remove the fill material disposed above third hard mask layer 1000. For example, an oxide recess or wet etch process may be performed to remove second fill material 1110 (FIG. 15) and upper portions of the third fill material 1510 (FIG. 15) above third hard mask 1000.

Figure 17:
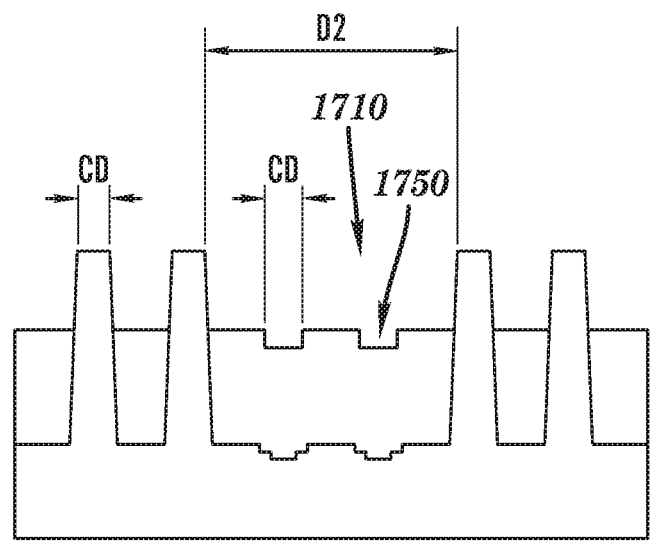

Third hard mask 1000 and first hard masks 404 are removed to form the intermediate structure shown in FIG. 17 having a fin-cut region 1710 with increased spacing D2 between some of the fins compared to the spacing D1 between other of the fins, and trenches 1750 formed in the fin-cut region. For example, a nitride removal process may be performed to remove third hard mask 1000 and hard masks 404.

With reference again to FIG. 10, third hard mask layer 1000 and fill material 1110 disposed on third hard mask layer 1000 aids in anchoring the fin reveal position, defining the fin reveal height, and maintaining the fins having a uniform critical dimension, e.g., when etching of the intermediate structure of FIG. 15 to form the intermediate structure of FIG. 16. In contrast, without a third hard mask layer, a fin reveal loading effect may result a fin reveal loading effect such as with fins having different critical dimensions.

Figure 18:
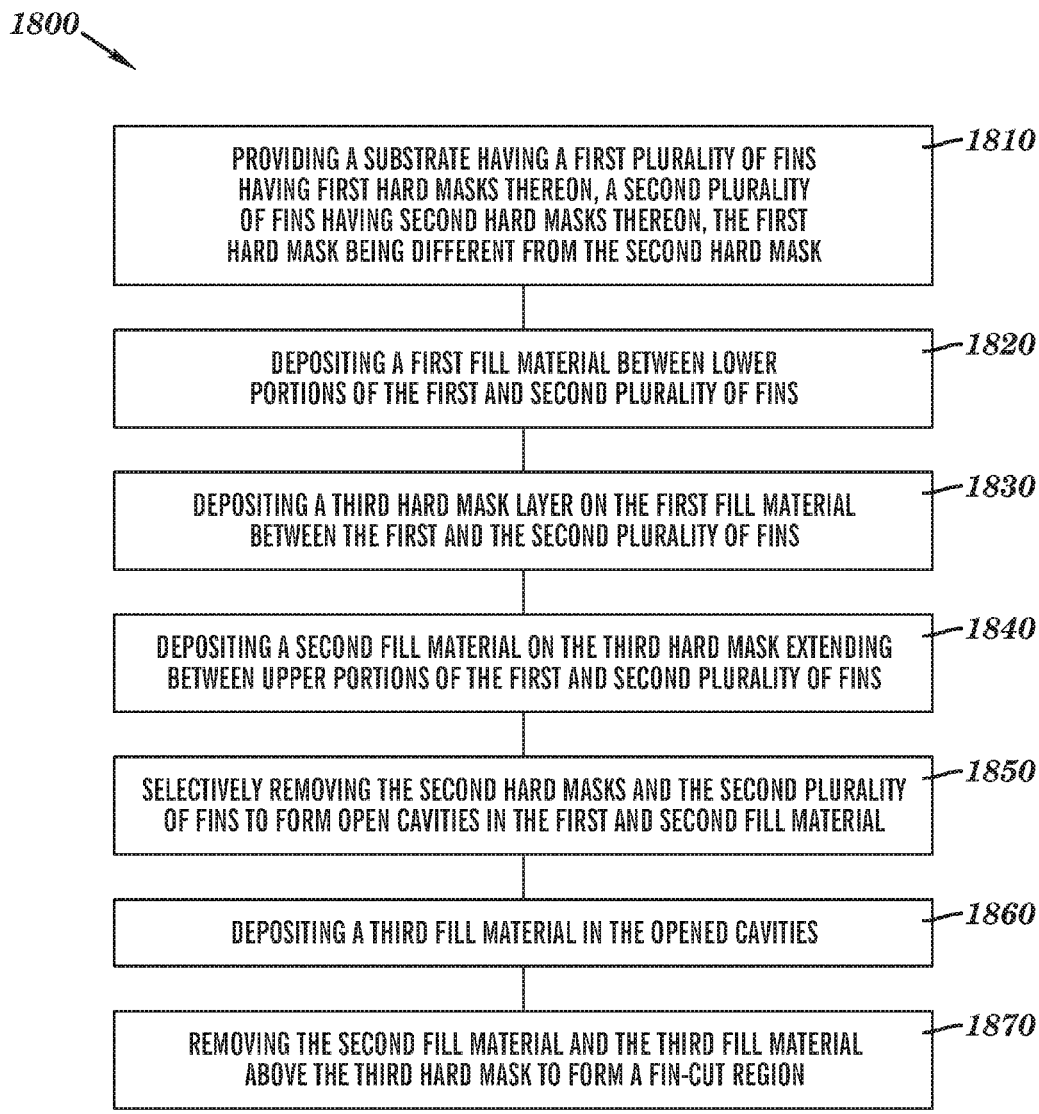
FIG. 18 is a flowchart illustrating a method for forming semiconductor structures employing selective removal of fins according to an embodiment of the present disclosure.

FIG. 18 is a flowchart of another embodiment of a method 1800 according to an embodiment of the present disclosure. Method 1800 includes at 1810 providing a substrate having a first plurality of fins having first hard masks thereon, a second plurality of fins having second hard masks thereon, the first hard mask being different from the second hard mask, at 1820 depositing a first fill material between lower portions of the first and second plurality of fins, at 1830 depositing a third hard mask layer on the first fill material between the first and the second plurality of fins, at 1840 depositing a second fill material on the third hard mask extending between upper portions of the first and second plurality of fins, at 1850, selectively removing the second hard masks and the second plurality of fins to form open cavities in the first and second fill material, at 1860 depositing a third fill material in the opened cavities, and at 1870 removing the second fill material and the third fill material above the third hard mask.

It will be appreciated that the present disclosure may provide a better cut margin, better taper device compatibility compared to a conventional "fin cut first" process. The present disclosure may provide a more uniform fin height and no loading effect compared to a conventional "fin cut last" process. The present disclosure may avoid the problems last fin taper and fin reveal loading effect typically resulting from a "fin cut first" process, and may avoid the problem in the "fin cut last" process of only compatible with fin cut last.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of one or more aspects of the present disclosure and the practical application, and to enable others of ordinary skill in the art to understand one or more aspects of the disclosure for various embodiments with various modifications as are suited to the particular use contemplated.

The invention claimed is:

1. A method comprising:
providing a substrate having a first plurality of fins having first hard masks thereon, a second plurality of fins having second hard masks thereon, the first hard mask being different from the second hard mask;
depositing a first fill material between lower portions of the first and second plurality of fins;
depositing a third hard mask layer on the first fill material between the first and the second plurality of fins;
depositing a second fill material on the third hard mask extending between upper portions of the first and second plurality of fins;
selectively removing the second hard masks and the second plurality of fins to form open cavities in the first and second fill material;
depositing a third fill material in the opened cavities; and
removing the second fill material and the third fill material above the third hard mask to form a fin-cut region.

2. The method of claim 1 wherein the first plurality of fins and the second plurality of fins have a corresponding same critical dimension.

3. The method of claim 1 wherein the first plurality of fins and the second plurality of fins have a same pitch therebetween.

4. The method of claim 1 wherein the selectively removing the second plurality of fins comprises etching.

5. The method of claim 1 wherein the selectively removing the second plurality of fins comprises a first etching and a second etching, and wherein the first etching is different from the second etching.

6. The method of claim 1 wherein the selectively removing the second plurality of fins comprises an anisotropic etch.

7. The method of claim 1 wherein the selectively removing the second plurality of fins comprises performing an isotropic etch.

8. The method of claim 1 wherein the selectively removing the second plurality of fins comprises an anisotropic etch followed by an isotropic etch.

9. The method of claim 1 wherein the depositing the third hard mask layer comprises a directional deposition.

10. The method of claim 1 wherein the depositing the third hard mask layer comprises depositing a liner on the first fill material between the first and the second plurality of fins and on the first and the second plurality of fins.

11. The method of claim 1 wherein the first fill material, second fill material, and third fill material comprise the same material.

12. The method of claim 1 wherein the first fill material, second fill material, and third fill material comprise an oxide.

13. The method of claim 1 wherein the first hard masks comprise SiBCN and the second hard masks comprise SiN.

14. The method of claim 1 wherein the first hard masks comprise SiN and the second hard masks comprise SiCO, or the first hard masks comprise SiCO and the second hard masks comprise SiN.

15. The method of claim 1 wherein the first plurality of fins and the second plurality of fins have a corresponding same critical dimension, and the first plurality of fins and the second plurality of fins have a same pitch therebetween.

16. The method of claim 1 wherein the providing comprises forming a plurality of hard masks comprising the first material on the substrate, selectively replacing some of the hard marks with the second hard masks comprising the second material.

* * * * *